United States Patent [19]

Min et al.

[11] Patent Number: 5,141,721
[45] Date of Patent: Aug. 25, 1992

[54] APPARATUS FOR GROWING A SINGLE CRYSTAL OF A SEMICONDUCTOR COMPOUND BY USING A HORIZONTAL ZONE MELT TECHNIQUE

[75] Inventors: Suk K. Min; Yong J. Park; Seung C. Park; Chul W. Han, all of Seoul, Rep. of Korea

[73] Assignee: Korea Institute of Science and Technology, Seoul, Rep. of Korea

[21] Appl. No.: 689,167

[22] Filed: Apr. 22, 1991

[30] Foreign Application Priority Data

Dec. 7, 1990 [KR] Rep. of Korea ............ 20134/1990

[51] Int. Cl.⁵ .................................................. B01D 9/00
[52] U.S. Cl. .................................. 422/250; 156/601; 156/620.7; 156/620.72; 156/620.76; 422/248
[58] Field of Search ............ 156/601, 620.7, 620.72, 156/620.76; 422/248, 250

[56] References Cited

U.S. PATENT DOCUMENTS

| | | | |
|---|---|---|---|
| 3,433,627 | 3/1969 | Liang et al. | 156/620.76 |
| 3,884,642 | 5/1975 | Benedict | 156/620.72 |
| 4,030,964 | 6/1977 | Schieber et al. | 156/601 |
| 4,565,156 | 1/1986 | Nishizawa et al. | 437/119 |
| 4,907,177 | 3/1990 | Curreri et al. | 156/601 |
| 4,918,029 | 4/1990 | Kim | 437/119 |
| 4,925,636 | 5/1990 | Hemmerdinger et al. | 156/620.7 |
| 4,957,711 | 9/1990 | Min et al. | 422/245 |

Primary Examiner—Robert Kunemund
Assistant Examiner—Felisa Garrett
Attorney, Agent, or Firm—Darby & Darby

[57] ABSTRACT

An apparatus for growing a single crystal of a semiconductor compound of Group III-V or Group II-VI such as GaAs, InP, or CdTe by using a horizontal zone melt technique. A direct monitoring furnace comprising a double quartz tube made of a transparent material is disposed in the high temperature section of the grower, thereby enabling the observation of the entire crystal growth procedure with the naked eye or with a CCD (charge coupled device) camera tube, enabling high-speed variation of temperature gradient as well as high-speed heating, and thus enabling the single crystal growth of GaAs with low defects and high uniformity, and thus enabling the single crystal growth of GaAs with low defects and high uniformity in the axial direction of growth. The direct monitoring furnace includes a sub-heater as well as a main heating wire, so that a spike zone can be formed, thereby enabling the manufacture of GaAs wafers with low defects and high uniformity.

4 Claims, 3 Drawing Sheets

APPARATUS FOR GROWING A SINGLE CRYSTAL OF A SEMICONDUCTOR COMPOUND BY USING A HORIZONTAL ZONE MELT TECHNIQUE

BACKGROUND OF THE INVENTION

The present invention relates to an apparatus for growing a single crystal of a semiconductor compound by using a horizontal zone melt technique, and more particularly to an apparatus for growing a single crystal of a semiconductor compound of Group III-V or Group II-VI such as GaAs, InP, or CdTe by using a horizontal zone melt technique.

At the present time, a horizontal Bridgman method and a liquid encapsulated Czochralski method are generally used as a practical method for growing a single crystal in manufacturing GaAs wafers.

In these methods, the entire single crystal growth procedure is carried out at high temperature of at least 1,238° C., that is, the melting point of GaAs. Consequently, they have a disadvantage that unnecessary residual impurities are inevitably present in final products, in that the GaAs melt is continuously maintained in contact with a reaction container at high temperature.

Furthermore, when impurities such as In or Si are added for the purpose of lowering the dislocation density in crystals, inherent segregation coefficients of respective impurities result in a relatively increased difference between the concentration of impurities at the beginning of the growth and the concentration of impurities at the end of the growth. In result, there is a problem of poor uniformity in the direction of crystal growth, which causes poor uniformity of electrical properties in the crystals. This poor uniformity of electrical properties in the direction of crystal growth lowers the yield of the growth, thus it is required to provide an improvement therein. Considering that the problem of lowering the yield is caused by the poor uniformity of the growth encountered in the above-mentioned horizontal Bridgman method and liquid encapsulated Czochralski method, a horizontal zone melt technique for growing crystals is noticeable as a technique for increasing the yield of the crystals.

The horizontal zone melt technique had been initially proposed by J. L. Richard in conjunction with the growth of single crystals of GaAs [Please refer to J. L. Richard, J. Appl. Phys, 31,600 (1960)]. In this horizontal zone melt technique, the GaAs melt is locally present, so that the penetration of impurities into a reaction container or tube containing the melt can be minimized. Accordingly, the concentration of the impurities is uniformly maintained in the direction of crystal growth, thereby enabling the yield of crystals to be increased. Recently, application of this technique has been extended to the manufacture of wafers with a relatively large diameter, for example, up to 3 inch [please refer to S. Mizuniwa, M. Kashiwa, T. Kurihara and S. Okubo, Hitachi Cable Rev. No. 7,51 (1988)].

However, conventional single crystal growers using the above-mentioned horizontal zone melt technique use mostly an electric ceramic furnace which is disposed at the high temperature section of each grower, whereby it is difficult to effectively form a flat temperature profile zone at the high temperature section. Furthermore, the entire procedure of single crystal growth cannot be practically observed. In result, it is difficult to grow single crystals reproducibly.

SUMMARY OF THE INVENTION

Therefore, an object of the present invention is to overcome the above-mentioned disadvantages encountered in the conventional single crystal growers using the horizontal zone melt technique and to provide an apparatus for growing single crystals by using the horizontal zone melt technique wherein a direct monitoring furnace comprising a double quartz tube made of a transparent material is displaced in the high temperature section, thereby enabling the observation of the entire crystal growth procedure with the naked eye or with a CCD (charge coupled device) camera tube, enabling high-speed variation of temperature gradient as well as high-speed heating, and thus enabling the single crystal growth of GaAs with low defects and high uniformity reproducibly.

In particular, the direct monitoring furnace according to the present invention can be heated to form a temperature zone of at least 1,238° C. and then cooled in a short time, thereby enabling a flat high temperature zone to be maintained. Accordingly, a spike zone can be effectively formed by the heating of the sub-heater.

In accordance with the present invention, the interior of the direct monitoring furance is visible to the naked eye, so that the observation of the entire crystal growth procedure with the naked eye or the observation of the liquid-solid interface with the CCD camera tube can be accomplished, thereby enabling optimum crystal growth conditions to be easily found.

The direct monitoring furnace of the present invnetion is on the basis of a direct monitoring furnace disclosed in U.S. Pat. No. 4,957,711, Sept. 18, 1990 Korean Patent (corresponding to Application No. 88-8305 entitled "A horizontal Bridgman single crystal growing apparatus using a direct monitoring furnace") and another direct monitoring furnace disclosed in Korean Patent Application No. 90-4653 entitled "An apparatus for growing a single crystal of a semiconductor compound by using a vertical-temperature gradient freeze technique". As compared with the above-mentioned prevcious furnaces, the direct monitoring furnace of the present invention employs a sub-heater wire and a CCD camera, in order to be adapted to the horizontal zone melt method.

BRIEF DESCRIPTION OF THE DRAWINGS

Numerous other features, objects and advantages of the present invention will become apparent from the following description when read in connection with the accompanying drawings in which.

DETAILED DESCRIPTION OF THE PREFERRED EMBODIMENTS

Figure 1:
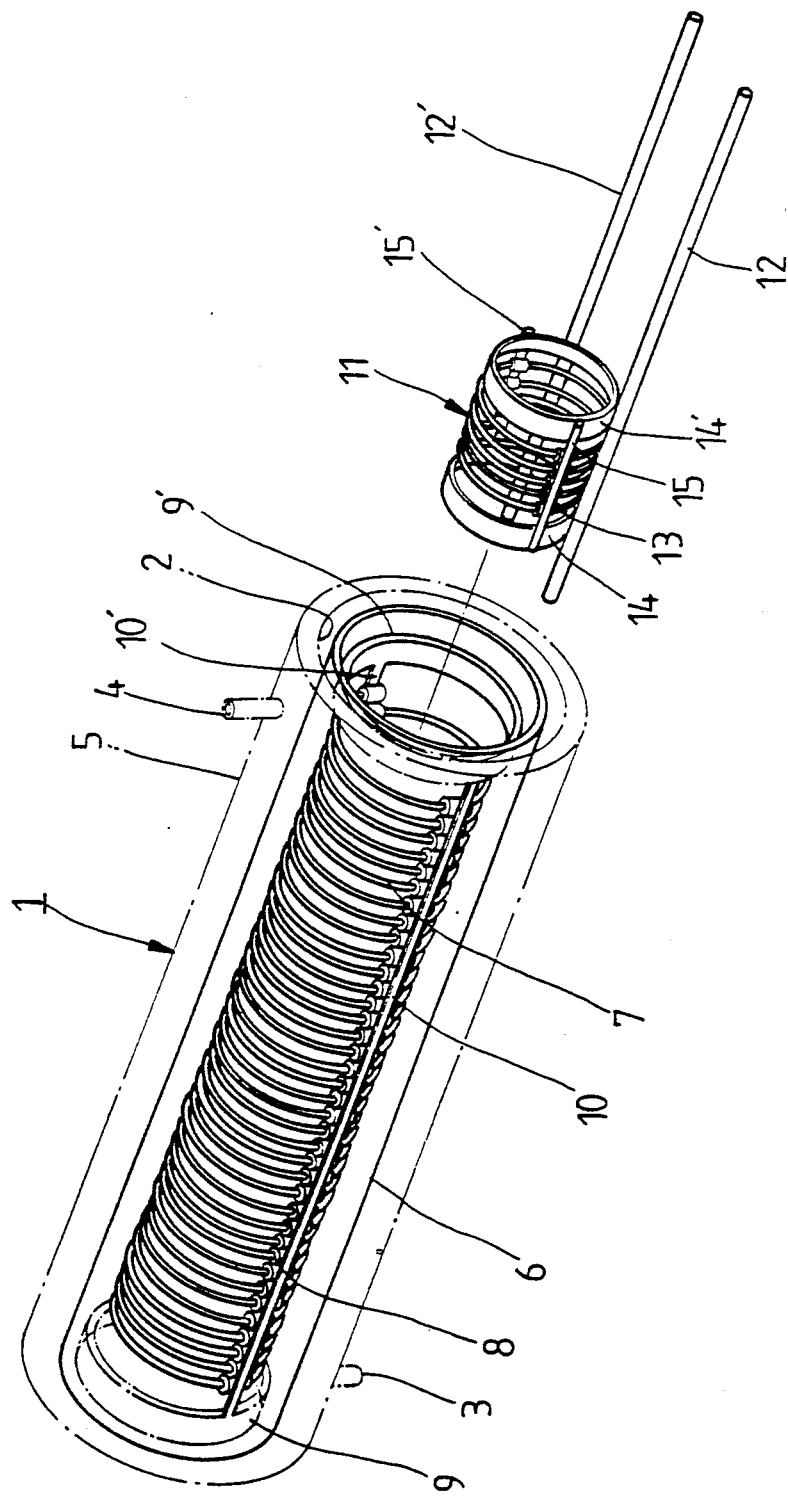
FIG. 1 is a partially-exploded perspective view of a direct monitoring furance provided in a horizontal zone melt-single crystal growing apparatus in accordance with the present invention.

Referring to FIG. 1 there is shown a direct monitoring furnace provided in an apparatus for growing single crystals in accordance with the present invention. The direct monitoring furnace which is designated by the reference numeral "1" is mounted on a high temperature section of the grower, in order to form a spike zone. The direct monitoring furnace 1 comprises a double quartz tube 5 provided at the inner wall surface thereof with a gold film 2 coated with a gold solution and at the outer wall surface thereof a cooling water inlet 3 and a cooling water outlet 4 which enable the circulation of cooling water within said double quartz tube 5. Within the double quartz tube 5, a protective quartz tube 6 is provided which is adapted to prevent the gold film 2 from being directly heated. Within the protective quartz tube 6, a spiral-type main heating wire 7 is provided which has two different temperature zones. The main heating wire 7 is supported by a plurality of spacers 8 made of alumina material and arranged along the length of and at both sides of said main heating wire 7. Each of spacers 8 is fitted around each wire turn of said main heating wire 7 and adapted to prevent adjacent wire turns from being in contact with each other. In order to maintain its original shape during the heating, the main heating wire 7 is also supported by a main heating wire-supporting assembly comprising a pair of supporting ceramic rods 10 and 10' extending along the length of the main heating wire 7 and securely adhering to two rows of spacers 8 each arranged at each side of the main heating wire 7, respectively, and a pair of supporting ceramic rings 9 and 9' securely adhering to both ends of each supporting ceramic rod, respectively. Thermocouples (not shown in the drawings) for controlling temperatures are provided in two temperature zones, respectively, in order to form flat temperature zones.

Within the main heating wire 7, a concentric heating wire 11 is provided which is shaped into a spiral similar to the main heating wire 7 and adapted to form a spike zone. The sub-heater 11 is disposed on a pair of parallel ralls 12 and 12' made of alumia material to move along them, thereby enabling the position of formed spike zone to be shifted.

Similar to the main heating wire 7, the sub-heater 11 is supported by a plurality of spacers 13 made of alumina material and arranged along the length of and at both sides of said sub-heater 11. Each of spacers 13 is fitted around each wire turn of said sub-heater 11 and adapted to prevent adjacent wire turns from being in contact with each other. In order to maintain its original shape during the heating, the sub-heater 11 is also supported by a sub-heater-supporting assembly comprising a pair of supporting ceramic rods 15 and 15' extending along the length of the sub-heater 11 and securely adhering to two rows of spacers 13 each arranged at each side of the sub-heater 11, respectively, and a pair of supporting ceramic rings 14 and 14' securely adhering to both ends of each supporting ceramic rod, respectively. A thermocouple (not shown in the drawings) for controlling temperatue is attached to the sub-heater 11, in order to provide a temperature profile of the spike zone.

Figure 2:
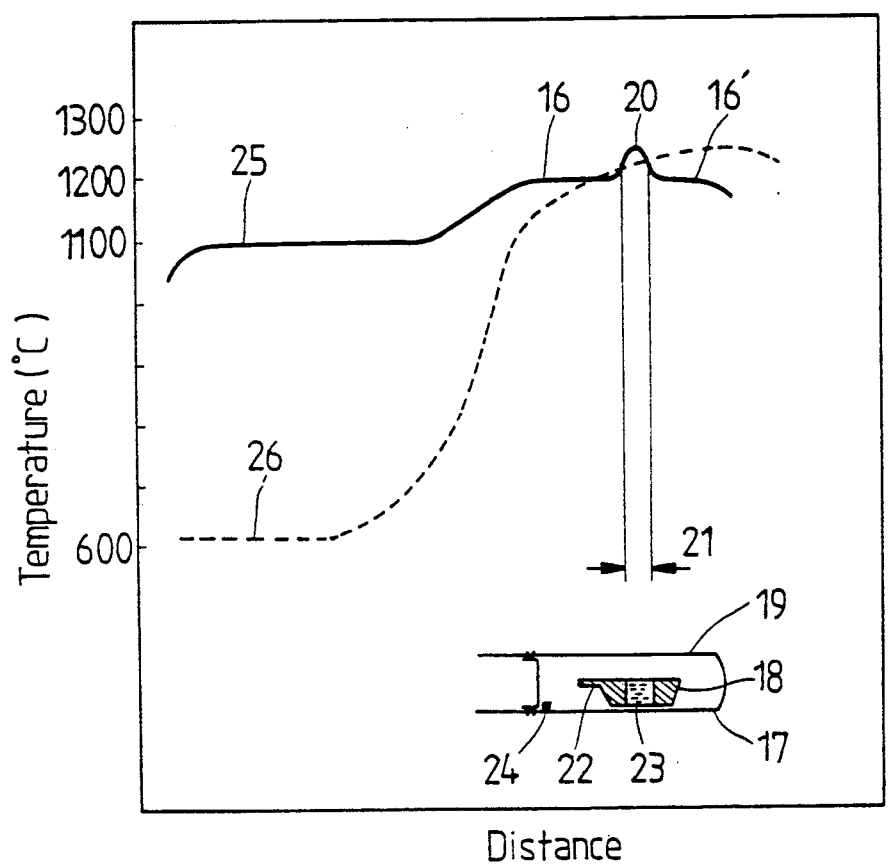
FIG. 2 is a graph showing a typical temperature profile in the horizontal zone melt-single crystal growing apparatus in accordance with the present invention.

Referring to FIG. 2, there is shown a typical temperature profile established within the high temperature section-electric furnace of the horizontal zone melt-single crystal growing apparatus as constructed in accordance with the present invention.

In FIG. 2, the solid line indicates a temperature profile within the horizontal zone melt-single crystal growing apparatus using the direct monitoring furnace according to the present invention, while the dotted line indicates a temperature profile within a growing apparatus using the conventional 2T-HB (two temperature zone horizontal Bridgman) method. As apparent from the temperature profile indicated by the solid line, the main heating wire 7 of the direct monitoring furnace 1 forms flat temperature zones 16 and 16' which can uniformly maintain GaAs 19 contained in a reaction container 18 within a reaction tube 17, at about 1,200° C. On the other hand, the spike zone 20 formed by the sub-heater 11 locally heats the reaction container 18 up to at least 1,238° C., that is, the melting point of GaAs, thereby causing a melt zone 21 to be formed. The width of the melt zone 21 is a few centimeters and can be varied, depending upon the change of the maximum temperature of the spike zone 20.

Crystal growth under the above temperature profile is accomplished by positioning the spike zone 20 formed by the heating of the sub-heater 11 on one end of the reaction container 18 at which a seed crystal 22 is present, carrying out a seeding procedure of the GaAs melt 23 in the melt zone 21 and the seed crystal 22 in order to contact the GaAs melt 23 with the end of the seed crystal 22, and then slowly moving the solid line-temperature profile at a certain rate.

In the drawings, the reference numeral "24" is arsenic adapted to maintain the interior of the reaction tube 17 at 1 atm of pressure.

In accordance with the present invention, a temperature profile 25 in the low temperature section is maintained at about 1,100° C. which is a contrast to the temperature of 617° C. in the case of the temperature profile 26 according to the conventional horizontal Bridgman method. Accordingly, it is possible to reduce the influence of the temperature variation of the low temperature section-electric furnace on the stoichiometry of melt. Also, heat-treated effect can be obtained after the completion of crystal growth.

Figure 3:
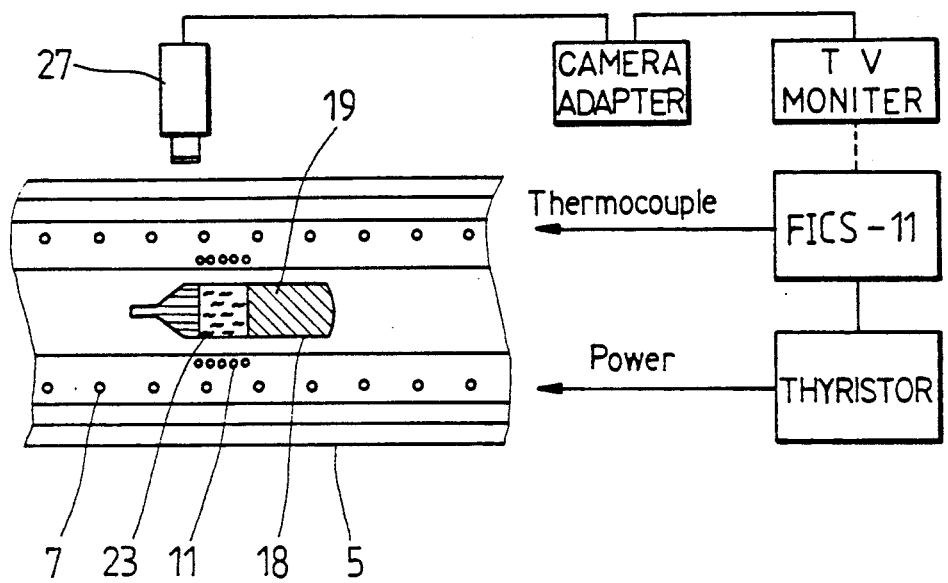
FIG. 3 is a schematic view showing that a CCD camera tube is disposed at the outside of the horizontal zone melt-single crystal growing apparatus in accordance with the present invention.

In the crystal growing apparatus of the present invention, the entire crystal growth procedure can be directly observed through the high temperature section-direct monitoring furnace, with the naked eye or with the CCD camera tube, as above mentioned. Referring to FIG. 3, there is schematically shown a construction for observing the crystal growth procedure through the CCD camera tube.

At the outside of the direct monitoring furnace 1 in which the reaction container 18 is positioned within the main heating wire 7 and the sub-heater 11 provided inthe double quartz tube 5, a CCD camera tube 27 is disposed, so that an image received in said CCD camera tube 27 is transmitted through a camera tube adapter to a TV monitor on which a picture corresponding to said image is produced.

On the other hand, a precise temperature control for the electric furnace is achieved by a furnace integrated control system ((Eurotherm International Co., FICS-11 model).

Figure 4:
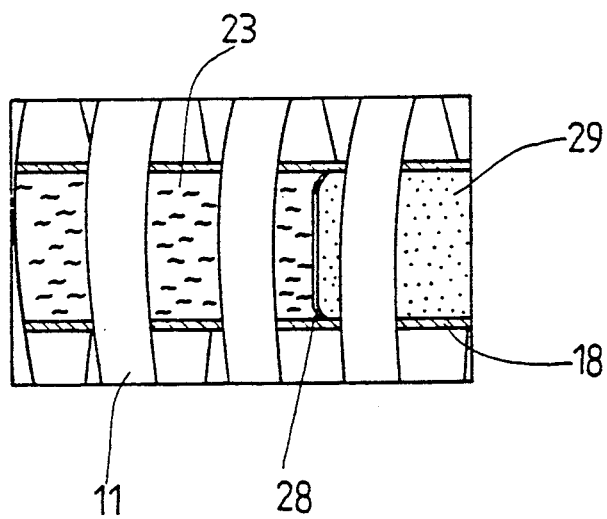
FIG. 4 is a schematic view of a liquid-solid interface imaged on a TV monitor through the CCD camera tube.

FIG. 4 shows a picture produced on the TV monitor by monitoring liquid-solid interface during the growth procedure of GaAs single crystals with the CCD camera tube device shown in FIG. 3. In the drawing, GaAs contained in the reaction container 18 surrounding by the sub-heater 11 and is present as a liquid GaAs 23 at the left side and a single crystal GaAs 29 at the right side with respect to the liquid-solid interface 28 perpendicular to the axial direction of crystal growth. As the sub-heater 11 is slowly moved in horizontal to shift the spike zone, the liquid-solid interface 28 slowly moves left to grow GaAs single crystals 29.

The single crystals obtained by the single crystal grower using the direct monitoring electric furnace in accordance with the present invention exhibit low defects and high uniformity along the axial direction of crystal growth.

The direct monitoring furnace which comprises a double quartz tube coated with a gold film in accordance with the present invention exhibits a string heat concentration at the high temperature section, thereby enabling a uniform temperature profile to be obtained, and thus an effective spike zone to be easily formed. In that the entire crystal growth procedure including the liquid-solid interface can be directly observed with the naked eye or with CCD camera tube, single crystals of Group III-V and Group II-VI semiconductor compounds as well as GaAs can be grown reproducibly.

What is claimed is:

1. An apparatus for growing a single crystal of a semiconductor compound by using a horizontal zone melt technique comprising a low temperature section-electric furnace which maintains a temperature profile of about 1,100° C. and a high temperature section-electric furnace, wherein said high temperature section-electric furnace comprises a direct monitoring furnace including:

a double quartz tube provided at the inner wall surface thereof with a gold film coating and at the outer wall surface thereof a cooling water inlet and a cooling water outlet;

a protective quartz tube disposed within said double quartz tube and adapted to prevent said gold film from being directly heated;

a spiral-type main heating wire disposed within said protective quartz tube and divided into two different temperature zones, said main heating wire maintaining a flat temperature zone of about 1,200° C.; and a sub-heater concentrically disposed within said main heating wire and adapted to form a spike zone, said sub-heater forming a spike zone of about 1,250° C.

2. An apparatus in accordance with claim 1, wherein said sub-heater includes a plurality of spacers made of alumina material and arranged along the length of and at both sides of the sub-heating wire to form two rows, each of said spacers being fitted around each wire turn of the sub-heater and a sub-heater-supporting assembly comprising a pair of supporting ceramic rods extending along the length of the sub-heater and securely adhering to two rows of spacers, respectively, and a pair of supporting ceramic rings securely adhering to both ends of each supporting ceramic rod, respectively.

3. An apparatus in accordance with claim 1, wherein said sub-heater is disposed on a pair of parallel rails made of alumina material to move with respect to said main heating wire.

4. An apparatus in accordance with claim 1, wherein a CCD camera tube connected to a TV monitor is disposed at the outside of said direct monitoring electric furnace.

* * * * *